(12) United States Patent
Howe et al.

(10) Patent No.: US 7,075,378 B2
(45) Date of Patent: Jul. 11, 2006

(54) HIGH SPECTRAL PURITY MICROWAVE OSCILLATOR USING AIR-DIELECTRIC CAVITY

(75) Inventors: David A. Howe, Louisville, CO (US); Amitava Sen Gupta, New Delhi (IN); Craig Nelson, Boulder, CO (US); Fred L. Walls, Boulder, CO (US)

(73) Assignee: The United States of America as represented by the Secretary of Commerce, the National Institute of Standards and Technology, Gaithersburg, MD (US)

( * ) Notice: Subject to any disclaimer, the term of this patent is extended or adjusted under 35 U.S.C. 154(b) by 42 days.

(21) Appl. No.: 10/885,118

(22) Filed: Jul. 7, 2004

(65) Prior Publication Data

US 2005/0007204 A1    Jan. 13, 2005

Related U.S. Application Data

(60) Provisional application No. 60/486,524, filed on Jul. 11, 2003.

(51) Int. Cl.
*H03B 5/18* (2006.01)

(52) U.S. Cl. .............. 331/96; 331/117 D; 331/107 DP; 331/175; 331/107 G; 331/68

(58) Field of Classification Search .................. 331/96, 331/117 D, 99, 175, 107 DP, 107 G, 68
See application file for complete search history.

(56) References Cited

U.S. PATENT DOCUMENTS

| | | | |
|---|---|---|---|
| 4,555,678 A | 11/1985 | Galani et al. | 331/1 A |
| 5,032,800 A | 7/1991 | Galani et al. | 331/1 R |
| 5,036,299 A | 7/1991 | Dick et al. | 331/25 |
| 5,150,080 A * | 9/1992 | Bianchini et al. | 331/99 |
| 5,233,319 A * | 8/1993 | Mizan et al. | 333/219.1 |
| 5,841,322 A | 11/1998 | Ivanov et al. | 331/1 R |

OTHER PUBLICATIONS

"High Spectral Purity X-Band Source"; F.L. Walls, C.M. Felton, T.D. Martin; Proc. 1990 IEEE Freq. Cont. Symp. pp. 542-548, May 23, 1990.

"Future Trends in the Development of Ultra-Low Noise Microwave Oscillators with Interfermetric Signal Processing"; E.N. Ivanov and M.E. Tobar; Proc. 1999 Joint Meeting EFTF-IEEE IFCS, Besancon, France, pp. 552-556.

* cited by examiner

*Primary Examiner*—Arnold Kinkead
(74) *Attorney, Agent, or Firm*—Stevens, Davis, Miller & Mosher, L.L.P.

(57) ABSTRACT

A high spectral purity microwave oscillator is provided. The Oscillator uses an air-dielectric cavity and employs the known carrier-suppression technique. In one embodiment, the oscillator employs a high-Q cavity to self-sustain an oscillating signal formed by feeding back into its input a power-amplified output signal of the cavity in which residual phase noise in the amplifier stages is suppressed. A bandpass filter selects the cavity mode. FIG. 1 illustrates this embodiment. Another embodiment suppresses the noise of a voltage-controlled oscillator whose frequency and power-amplified output interrogates the cavity mode. FIG. 2 illustrates this embodiment.

23 Claims, 3 Drawing Sheets

HIGH SPECTRAL PURITY MICROWAVE OSCILLATOR USING AIR-DIELECTRIC CAVITY

CROSS-REFERENCE TO RELATED APPLICATION

The present application claims priority to provisional application Ser. No. 60/486,524 filed Jul. 11, 2003, the contents of which are incorporated herein by reference in their entirety.

BACKGROUND OF THE INVENTION

1. Field of the Invention

The present invention relates to a low noise microwave oscillator. More particularly, the present invention relates to an oscillator using a high power radio frequency (RF) input into an air or evacuated conventional resonator to reduce noise.

2. Description of the Related Art

Microwave oscillators of high spectral purity are required as a local reference or clock signal in secure communications protocols, very high-speed jitter-sensitive modulation-demodulation schemes, and high-resolution digital signal processing applications such as imaging radar. These oscillators are designed to produce an oscillating signal at one frequency, the resonant or carrier frequency $v_{res}$, and to use a technique in which phase noise that is offset from $v_{res}$ by Fourier-frequency f is detected by the oscillator's resonator and subsequently suppressed. The methods of detection and strategy for suppression vary, but these two functions are common to the best oscillators.

The chronological stages of development of prior art by earlier inventors can be summarized as follows.

U.S. Pat. No. 4,555,678, issued Nov. 26, 1985 to Galani et al., the contents of which are incorporated herein by reference in their entirety, discloses using a high-Q cavity-based discriminator to degenerate (or cancel) noise in a microwave oscillator of the Direct Feedback Loop type. Subsequent inventors have not changed the basic concept of the cavity discriminator but have only added incremental changes to improve its performance and the extent of noise cancellation achieved. For example, U.S. Pat. No. 5,032,800, issued July 1991 to Galani et al., the contents of which are incorporated herein by reference in their entirety, 1991 teaches improved predictability of the feedback technique by introducing a voltage controlled phase shifter to vary and compensate the oscillator loop, and a noise-induced phase shift in accordance with the discriminator output for the noise cancellation.

U.S. Pat. No. 5,036,299, issued Jul. 16, 1991 to Dick et al., the contents of which are incorporated herein by reference in their entirety, teaches several modifications to the cavity discriminator approach. First, Dick et al. teaches the use of a cavity discriminator to clean up an external noisy oscillator—a system denoted as STALO (Stabilized Local Oscillator). A similar configuration for cleaning up a noisy DRO using the cavity was already disclosed in the open literature (F. L. Walls, C. M. Felton, T. D. Martin, "High Spectral Purity X-Band Source," Proc. 1990 IEEE Freq. Cont. Symp., pps. 542–548, May 23, 1990). Second, Dick et al. teaches the use of almost critical coupling for signal into the cavity. This results in a high level of "carrier suppression" in which the power in the center frequency of the external oscillator is reduced, while its noise is not. Third, Dick et al. claims the use of an RF amplifier to amplify the carrier-suppressed reflected signal. Improvements in the cavity discriminator performance resulting from Dick et al. inventions are twofold. First, the amplification of the reflected signal within the discriminator results in the increase of the discriminator gain. Second, carrier suppression of the reflected signal results in reduction of multiplicative noise introduced by this same amplifier, and the introduction of the amplifier before a phase-detector mixer resulted in overcoming the mixer noise, a heretofore key noise-limiting component. Thus, the invention of Dick et al. results in reduction of the effective noise due to components.

U.S. Pat. No. 5,841,322, issued Nov. 24, 1998 to Ivanov et al., the contents of which are incorporated herein by reference in their entirety, teaches a method for increasing carrier suppression using an "interferometer" arm of the reflected signal from the cavity to vectorially add to the reflected signal (using a power combiner) a portion of the input signal fed into the cavity with the same amplitude as the reflected signal, but whose phase has been shifted by 180° with respect to it. Ivanov teaches a very high level of carrier suppression can be achieved with fine amplitude and phase adjustments. Also, together with the carrier suppression already obtained by near critical coupling, it is possible to achieve a level of almost no carrier as seen by the Dick et al. amplifier of prior art. Hence, Ivanov et al. teach further elimination of its multiplicative noise, which is predominantly "flicker," a highly undesirable noise type. Using an RF amplifier with very low thermal noise and a very high gain, it is possible to then achieve both the desirable conditions of increased discriminator gain and lowered flicker noise in the phase detection.

Thus, prior art is focused on reducing the effects of noise in non-discriminator components comprising the phase-noise detector in the oscillator, which typically are mixers, amplifiers, combiners, and the like. That is, several novel techniques have been devised to reduce the close in noise of microwave oscillators (Galani et al., 1985; Galani et al., 1991; Dick et al., 1991 and Ivanov et al., 1998). In essence, all the foregoing techniques utilize a microwave cavity with high Q factor. They teach that this cavity can be used in two ways:

a) as a Direct feedback oscillator, where the cavity is integrated as a part of the feedback loop of the microwave oscillator; and b) as a Cavity Stabilized Oscillator, where the cavity is used to clean up an external noisy oscillator locked to it.

In either case (a) or (b), the role of the cavity is that of a frequency discriminator, which converts noise-induced frequency fluctuations from components ahead of the discriminator into corresponding phase variations of a signal reflected from it. A double balanced mixer, used as a phase detector, further converts the phase to voltage fluctuations, which are then suitably amplified and fed back to the oscillator to correct its frequency fluctuations. It is important to note that this phase detection noise is not cleaned up by the discriminator and ideally sets the noise floor. This noise is the focus of ongoing efforts to reduce oscillator noise.

In the case of the Direct Feedback Oscillator (a), the feedback is used to modulate the oscillator loop phase shift using a voltage controlled phase shifter. In the case of the Cavity Stabilized Oscillator (b), the feedback modulates the oscillator frequency using a voltage controlled tuning port of the oscillator.

The extent to which noise cancellation is achieved depends primarily on three factors:
a) the noise in the phase detection;
b) the gain and corresponding noise of the noise-suppressing feedback loop, which is comprised of the gain of the discriminator transfer function (or the slope of the frequency deviation vs. error voltage curve) plus the additional voltage gain outside the discriminator in phase-detector (a); and
c) the combined effective noise of all the components within the discriminator itself.

The lower the noise in the phase detection and higher the feedback loop gain, the more the noise suppressed. However, this is not true indefinitely. Maximum noise suppression corresponds to a situation where the residual oscillator frequency fluctuations produce corresponding voltage fluctuations at the discriminator output that become equal to the combined effective noise due to the components. This then determines the "noise floor" of the oscillator. Thus, in order to get the best possible noise cancellation using the high-Q microwave cavity it is necessary to have:
a) the highest possible discriminator gain; and
b) the lowest possible effective noise of the components of the discriminator at its output, namely in the phase detection.

Due to the shortcomings of prior art systems discussed above, current research efforts are directed to very high-Q cavity resonators. These are ostensibly required to reduce the close in phase noise, usually flicker noise. In all relevant prior-art systems, a sapphire loaded cavity (SLC) operating in the very high-mode "whispering gallery" mode has been chosen as the resonator for the discriminator, owing to its very high Q. Q values obtained are typically $2 \times 10^5$ at room temperatures and $4-5 \times 10^6$ at cryogenic, ultra-low temperatures (higher Q's in some case by superconductivity). Accordingly, oscillator expense and complexity has increased significantly, resulting in a need for a lower cost and less complex oscillator that can achieve the same or better performance than prior art devices.

SUMMARY OF THE INVENTION

The present invention is directed to an oscillator comprising a normal air/vacuum-filled power-cavity thereby mitigating cost and complexity penalties of the prior art while achieving the same or better performance.

Noise level increases as the carrier-offset frequency f decreases. That increased noise level is usually at a rate of at least $1/f^3$ resulting in random noise that is very high close to the carrier frequency. This type of noise is referred to as flicker FM (flicker frequency modulation) noise, whose origin is flicker PM (flicker phase modulation) noise in the amplifier and other component-related noise within the resonator bandwidth (BW).

Oscillators with the highest spectral purity use a high-Q cavity resonator, which is configured as a phase-noise detector of excess phase noise in the oscillator-sustaining part of the oscillator (a positive-feedback amplifier). The detected noise translates to a voltage applied as either a feedback (using a phase locked loop (PLL) 217) or feedforward (using a phase modulator) error-correction signal to the oscillating output frequency via a voltage-controlled phase shifter (VCP) 106 or electronic frequency control (EFC) 206. The detector is basically a frequency discriminator that can use a variety of high-Q resonating devices. The lowest noise discriminators use either an air or dielectrically-loaded cavity. A low-loss, long delay line, such as a long optical fiber wound on a spool, can also be used as a discriminator. A delay-line discriminator using an optical fiber promises to have low vibration sensitivity. Unfortunately, delay-line discriminators have a response that repeats with spacing f=1/(delay). For long delays, nearby responses cause relatively high-level spurious lines above and below a given main discriminator response. The low inherent phase noise of the discriminator ultimately sets the lower limit of the phase noise of the oscillator. To satisfy the need for spur-free microwave reference sources, cavity discriminators that are designed to have a single mode with few neighboring modes are preferred over delay-line discriminators.

The oscillator of the present invention has the following characteristics:
a) includes a frequency-stabilizing discriminator having linear characteristics over a wide power range; and
b) limits output noise by the intrinsic noise of the discriminator itself.

The present invention is directed to exploiting an oscillator's discriminator noise without being limited in noise performance by the oscillator's non-discriminator components.

To these ends, the present invention is based on:
a) an air/vacuum dielectric resonator that has unique, ideal properties as a discriminator;
b) a model of an oscillator noise that is accurate, indicating that unprecedented discriminator signal-to-noise ratio and consequently ultra-low wideband noise from a microwave oscillator is possible;
c) a working model that has been built to fully exploit these unique properties;
d) the principle that the noise of components, other than the discriminator, do not dominate,
e) the further principle that the oscillator noise floor is ultimately the discriminator noise, and
f) the fact that close-in flicker noise is non-existent, due to the linearity of air/vacuum dielectric which can operate at a high power level and still be below any power-breakdown threshold limit.

A first embodiment of the present invention comprises a power amplifier arranged between a prior-art oscillator and a cavity. As an alternative, a high-power oscillator is used in connection with an air/vacuum-filled cavity as a discriminator. The increased power input to the cavity increases the discriminator gain just as the low-level amplifiers used after the interferometer in the phase detector of Dick's and Ivanov's systems described above. Gain is directly proportional to the power input to the cavity and to the square of the unloaded cavity Q.

A second embodiment comprises an air/vacuum-filled, RF "over-moded" metal, metalized, or other high-conductivity material, cavity. Such a cavity typically has an unloaded Q of about 60,000 in the X-band. There is clearly a reduction in the discriminator gain as a result of its modest Q value compared to the SLC of the prior art. However, the present invention compensates for this by the use of high power into the cavity, which remains linear at this high power. On this point, it has been shown by Ivanov and Tobar (E. N. Ivanov and M. E. Tobar, "Future Trends in the Development of Ultra-Low Noise Microwave Oscillators With Interferometric Signal Processing," Proc. 1999 Joint Meeting EFTF-IEEE IFCS, Besancon, France, pps 552–556, the entire contents of which are hereby incorporated by reference) that increasing the power input to an SLC causes an increase in the AM to PM conversion and hence results in noticeable degradation of the close in phase noise. This effect is absent in an air/vacuum cavity resonator, thus permitting use with very high power levels.

Additional advantages of the air/vacuum-filled cavity of the second embodiment include:

a) It is possible to attain coupling values very close to unity (critical coupling) with ease and with excellent reproducibility. This is in contrast to the difficulty of achieving unity coupling with solid dielectrics and/or in closed cryogenic systems. Unity coupling enables significant reduction of the noise contribution due to the circulator that must be used in conjunction with the discriminator.

b) It is possible to obtain high output power for the final stabilized oscillator directly from the transmission port of the cavity, which can be very loosely coupled in order not to degrade the cavity Q further. Due to the high power into the cavity, no additional amplification (a source of additive noise) is needed for the final output from the cavity to the user's application.

c) It is less complex, hence more reliable, than prior art systems.

d) The present invention is lower in cost and easier to fabricate, analyze, and test when compared to the SLC and other prior systems that use, for example, low-temperature solid-dielectric resonators.

The foregoing features and advantages of the present invention will become further apparent from the detailed description that follows and the accompanying drawings.

Figure 1:
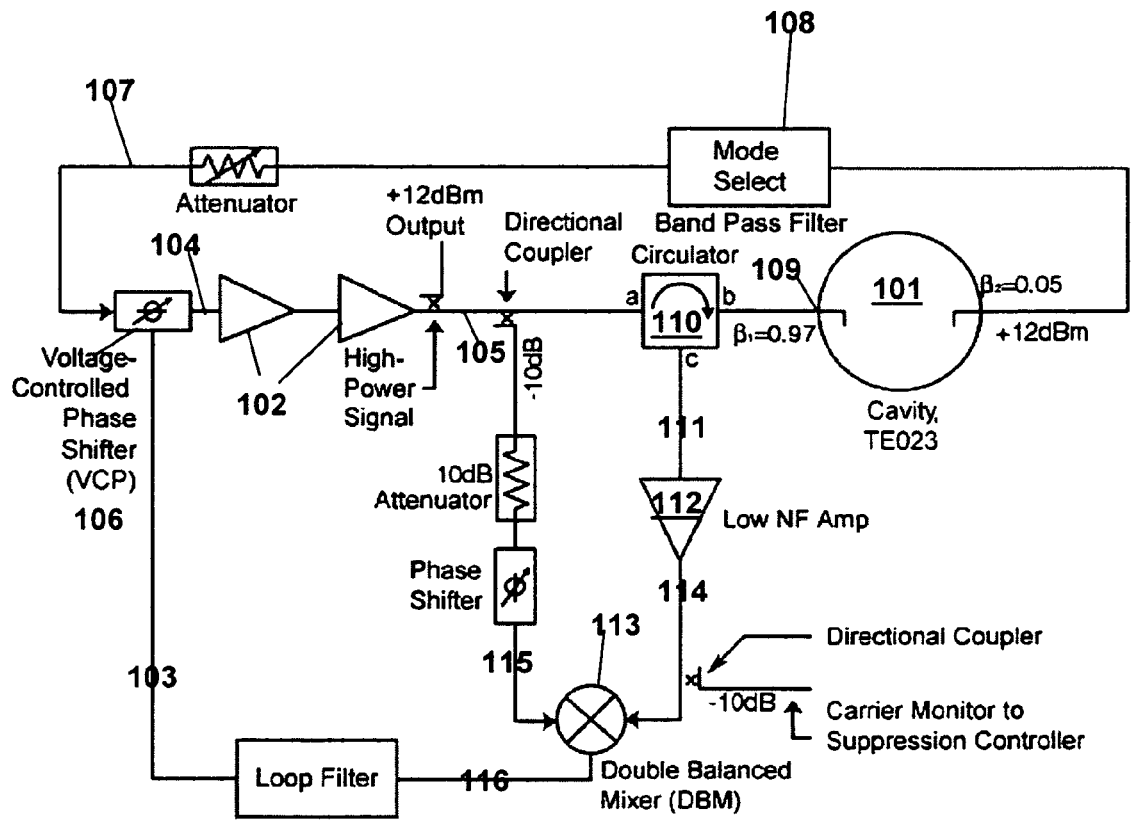
FIG. 1 illustrates an oscillator apparatus, according to an embodiment of the present invention, that employs a cavity mode to satisfy the oscillation conditions in a feedback loop around a power amplifier, wherein, phase noise due to the amplifier is detected with a carrier-suppressed, reflected signal from the cavity mode and a VCP corrects noise.

It is to be understood that these drawings are solely for purposes of illustrating the concepts of the invention and are not intended as a definition of the limits of the invention. The embodiments shown in the figures herein and described in the accompanying detailed description are to be used as illustrative embodiments and should not be construed as the only manner of practicing the invention. Also, the same reference numerals, possibly supplemented with reference characters where appropriate, have been used to identify similar elements in the various views of the Figures.

DETAILED DESCRIPTION

It is to be understood by persons of ordinary skill in the art that the following descriptions are provided for purposes of illustration and not for limitation. An artisan understands that there are many variations that lie within the spirit of the invention and the scope of the appended claims. Unnecessary detail of known functions and operations may be omitted from the current description so as not to obscure the present invention.

The present invention is based on proven oscillator designs that use the carrier-suppression technique, discussed below. FIG. 1 illustrates an apparatus, according to a first embodiment of the present invention, that uses a high-Q cavity 101 to self-sustain an oscillating signal formed by feeding back a power-amplifier output signal 103 (second output signal) into its input 104. Residual phase noise in the amplifier stages 102 is suppressed with a voltage-controlled phase shifter (VCP) 106 at the amplifier's input 104. The VCP's 106 input signal is the phase error between the oscillating signal and the cavity resonance mode (third output signal). A bandpass filter 108 selects the mode.

Figure 2:
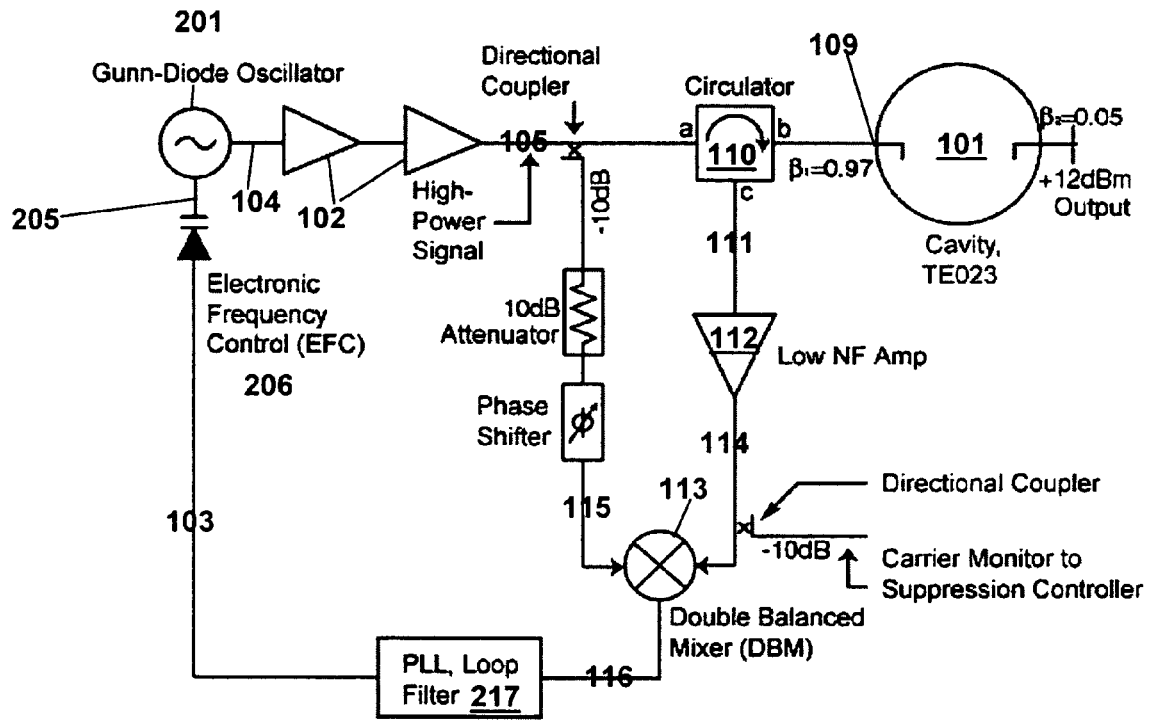
FIG. 2 illustrates an oscillator apparatus, according to an embodiment of the present invention, in which a VCO (Gunn oscillator) is phase-locked to a cavity resonance and a carrier-suppression technique is used in the phase detector.

FIG. 2 illustrates an apparatus, according to a second embodiment of the present invention, in which a separate voltage-controlled oscillator (VCO) 201 is locked to the center of a cavity resonance mode. The mode is selected by the VCO 201 frequency.

Both embodiments use the same frequency discriminator and phase noise detector, whose intrinsic noise sets the lower limit on the phase noise of the oscillating signal. Four factors are important to achieving significant improvement in the spectral purity of microwave oscillators in both embodiments:

a) sensitivity of the detector with its high-Q frequency discriminator must be as high as possible to exploit the low inherent resonator noise;

b) of all the possible types of resonators that can be used as a phase detector, conventional air-dielectric high-Q cavities are most ideally suited for handling large power levels with minimum complexity and cost;

c) the flicker noise behavior in air-dielectric resonators is below present measured sensitivities; and d) an oscillator's flicker FM behavior is due to multiplicative flicker PM noise in components, most notably the oscillator-sustaining amplifier.

To improve oscillator spectral purity, a) has been the focus in the oscillator community for many years. Sensitivity has traditionally been increased by increasing resonator Q, while the present invention is directed at increasing the incident power into the resonator. In particular, using the most sensitive phase noise measurement systems, flicker noise c) has yet to be detected in air-dielectric resonators. While compactness and high Q are possible using solid dielectrics, temperature sensitivity, nonlinearity at moderate power, and inability to obtain sufficient coupling and reduce stray leakage are negative factors. These introduce significant flicker FM or other random noise.

Further noise reduction in oscillators depends on amplifier advancements d). Close-to-carrier phase noise in amplifiers is proportional to signal power. Close-in, or low-f, phase noise requires a high degree of linearity and dynamic range from all components. Suppressing amplifier noise by improving the amplifier's linearity and dynamic range consequently reduces oscillator noise.

Oscillator Noise Model

Significant breakthroughs in lowering phase noise while increasing the oscillator's carrier frequency depend on predicting noise based on an accurate theoretical model of the various noise components. To increase the signal-to-noise ratio (SNR) of the phase detector, while reducing the flicker-noise contributed by other discriminator components, one wants to drive the detector with as much power as possible, and at the same time, null or suppress the correspondingly large carrier signal which presents itself at any amplifier, isolator, circulator, or other component with residual flicker noise that is proportional to signal power. This methodology is called the "carrier-suppression technique." FIGS. 1 and 2 illustrate schematic diagrams of the approach.

FIG. 2, for example, illustrates a system comprising a voltage-tunable oscillator such as a Gunn 201, or multiplied Yttrium-Iron-Garnet (YIG) oscillator or \dielectric resonator oscillator (DRO), whose output 104 (first output signal) is amplified 102 and the amplified output 105 (second output signal) is applied to a coupling port 109 of the discriminator cavity 101 through a circulator 110 or hybrid coupler. A reflected signal out of the cavity comes out of port C of the circulator 110 and is already highly suppressed since the coupling is very nearly critical. The highly suppressed signal 111 is then amplified using a low-noise amplifier 112 before being applied to one port of a phase detector, typically a double balanced mixer (DBM) 113. As a result of the high level of carrier suppression, i.e., low carrier signal, the amplifier output 114 exhibits a reduction in its flicker-noise contribution. The DBM 113 acts as a phase detector, whose other port has a portion of the input signal adjusted to be in phase quadrature with the reflected signal 115. By having the amplifier 112 before the mixer 113, the effective noise contribution from the mixer 113 is suppressed by the amplifier gain, and in practice, becomes relatively insignificant. The phase detector output 116 is the error signal (fourth output signal) that tracks the phase fluctuations of the oscillator relative to the cavity. This output 116 (fourth output signal) is a voltage that is proportional to phase fluctuations, regarded as an error, between the oscillating signal that drives the discriminator and the discriminator's more stable transfer or filter-response curve. This error voltage (fourth output signal) is applied through the servo amplifier 206 (as third input signal) to the voltage-control tuning input 205 of the oscillator 201 to stabilize its frequency.

The noise floor of the discriminator can be computed simply by realizing that it is the smallest, inherent signal power out of the DBM 113, which equals the sum of all the noise contributions from four different sources: (1) the discriminator amplifier, (2) the circulator 110 and its residual noise contribution to a signal passing from port a to b, (3) the residual circulator noise from port b to c, and (4) the noise of a voltage-controlled carrier suppressor, if one is used, modelled here as a phase shifter (VCP) 106. We have $$SP_{0rms} = N_{amp} + N_{circ(a-b)} + N_{circ(b-c)} + N_{vcp}. \quad (1)$$

Substituting the noise in terms of spectral density function $S_\phi^{nf}$, we get the noise floor for the discriminator as $$S_\phi^{nf}(f) = \frac{k_B(T_{amp} + T_0)}{P_i} \cdot \frac{(1+\beta_e)^2}{4\beta_e} \cdot \left(\frac{HLB}{f}\right)^2 + \quad (2)$$
$$S_\phi^{circ}(f) + \left\{\frac{(1-\beta_e)^2}{4\beta_e^2} \cdot \left(\frac{HLB}{f}\right)^2\right\}[S_\phi^{circ}(f) + S_\phi^{vcp}(f)]$$

where, $P_i$, $T_{amp}$, $T_0$ and $k_B$ are respectively the cavity incident power, effective noise temperature of the amplifier, ambient temperature (300K) and Boltzmann's constant.

$$\beta_e = \frac{\beta_1}{1+\beta_2}$$

is the effective cavity coupling coefficient and HLB is the half-loaded cavity bandwidth. The first term in (2) corresponds to the noise introduced by the microwave amplifier in the discriminator, and the second and third terms correspond to the circulator 110 and the VCP 106 noises.

The cavity's 101 Q is in terms of HLB in equation (2). Higher resonant modes have increased Q because of their decreased sensitivity to surface losses, which make up the principle resistive loss. However, higher modes have closer mode spacing, which can cause a distortion in the symmetry in the transfer characteristic of the main resonance line. Methods of choking nearby modes are often incorporated into cavity 101 designs to reduce main line asymmetry. A suitable compromise between mode spacing and cavity 101 Q is achieved with a TE023 or TE025 resonant mode. These higher modes provide an increase of Q by more than a factor of two over the fundamental TE011 mode. The overall dimensions of the cavity 101 are increased in going to higher modes. However, a reasonable tradeoff for mode spacing, size, and Q is realized with a TE023 mode, which is the preferred mode in subsequent discussions.

Figure 3:
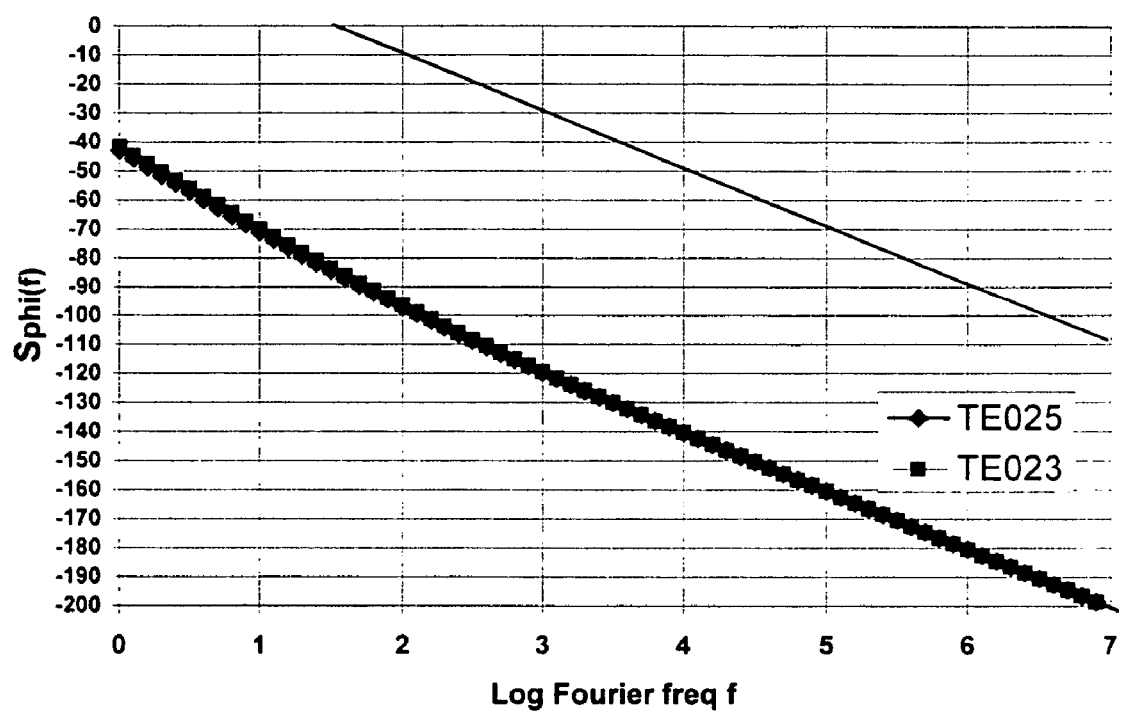
FIG. 3 illustrates 100 GHz cavity discriminator noise (1 Hz<f<10 MHz) of TE023 and TE025 modes, which show virtually identical theoretically attainable noise levels of the oscillators according to the present invention illustrated in FIGS. 1 and 2 using realistic parameters in equation (2) below wherein the solid line is performance of a typical 100 GHz low-noise Gunn oscillator.

FIG. 3 shows the theoretical noise floor 301 of a 100 GHz TE023 and TE025 cavity discriminator with realistic cavity parameters when driven by $P_i$=100 mW. PM noise decreases in proportion as $P_i$ increases, as seen in equation (2), and, of course, higher incident signal power levels are possible, but FIG. 3 provides an indication of oscillator noise level. VCP 106 and circulator 110 noise were assumed to be similar to devices operating at X-band. The solid line 302 in FIG. 3 is the performance of a typical low-noise, W-band Gunn oscillator.

Vibration and Acceleration Insensitivity

The convenience of small size and the need for low vibration and acceleration sensitivity must be factored into the invention, if these oscillators are to achieve wide usage. While not the main focus, this invention permits resonators of arbitrary size, and small cavities can have reduced deformations in the presence of acceleration and low-frequency vibration as their resonant frequency is increased due to the fact that cavity size is correspondingly reduced. For example, a high-frequency (mm-wavelength) 100 GHz TE023 right circular cylindrical cavity would have only a 1 cm cylindrical diameter and height in the open bore of the center of the cavity. Being small, the resonator can be readily fabricated at low cost and using ultra-stiff material (for example, ceramic, an example of which is a carbon product in the form of synthetic diamond) and isolated from acoustic and structure-borne vibration as well as cavity is fabricated such that it is isolated from acoustic and structure-borne vibration and other environmental effects. For example, frequency shifts can occur due to external temperature variations, radiation exposure, and high magnetic and electric fields. Further, said ultra-stiff material is modified to include properties that stabilize the frequency of the at least one cavity resonance mode. These properties include minimizing frequency shifts of air/vacuum cavities by minimizing only cavity dimensional shifts to external, environmental exposures. These means include numerous choices of wall materials, which can be coated with high conductivity metal, and mechanical self-compensation schemes, neither of which need affect the desirable signal properties of the air/vacuum cavity. In contrast, when high-Q, solid dielectrics are used, this limits the choice of materials and strategy for mitigating environmental sensitivities because desirable signal properties of the dielectric can be readily compromised.

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. It is expressly intended that all combinations of those elements that perform substantially the same function in substantially the same way to achieve the same results are within the scope of the invention. Substitutions of elements from one described embodiment to another are also fully intended and contemplated.

We claim:

1. A cavity stabilized oscillator for producing an oscillating signal, comprising:
   a voltage controlled phase shifter (VCP) to receive a second signal and a third signal and to produce therefrom a first signal;
   a cavity to receive a fourth signal and produce therefrom the oscillating signal, said cavity having at least one cavity resonance mode;
   a power amplifier to receive the first signal and produce therefrom the fourth signal, said amplifier being disposed between the VCP and the cavity; and
   a feedback loop to receive the fourth signal and a reflection of said oscillating signal and produce therefrom the second signal, said feedback loop being disposed between the VCP and the power amplifier,
   wherein, said at least one cavity resonance mode is employed to satisfy at least one pre-determined oscillation condition in the feedback loop, and a phase noise due to the power amplifier is corrected by the VCP; and wherein:
   said second signal comprises a phase error between the oscillating signal and the at least one cavity resonance mode; and
   said at least one mode is selected by a bandpass filter disposed between the cavity and the VCP to receive the oscillating signal and provide the selected at least one cavity resonance mode as the third signal, wherein said cavity is a high-Q air/vacuum dielectric cavity.

2. The oscillator of claim 1, wherein said cavity is selected from the group consisting of TE023 resonance mode and TE025 resonance mode.

3. A cavity stabilized oscillator for producing an oscillating signal, comprising:
   a voltage controlled phase shifter (VCP) to receive a second signal and a third signal and to produce therefrom a first signal;
   a cavity to receive a fourth signal and produce therefrom the oscillating signal, said cavity having at least one cavity resonance mode;
   a power amplifier to receive the first signal and produce therefrom the fourth signal, said amplifier being disposed between the VCP and the cavity; and
   a feedback loop to receive the fourth signal and a reflection of said oscillating signal and produce therefrom the second signal, said feedback loop being disposed between the VCP and the power amplifier,
   wherein, said at least one cavity resonance mode is employed to satisfy at least one pre-determined oscillation condition in the feedback loop, and a phase noise due to the power amplifier is corrected by the VCP;
   wherein a reflection of the oscillating signal from the cavity further comprises a carrier-suppression technique whereby a signal to noise ratio of a phase detector component thereof is increased by amplification of said reflection.

4. The oscillator of claim 3, wherein said phase detector component produces the second signal as a signal proportional to the phase error between the oscillating signal and said cavity resonance mode.

5. The oscillator of claim 4, wherein said at least one cavity resonance mode is selected by a bandpass filter disposed between the cavity and the VCP to receive the oscillating signal and provided as the third signal.

6. The oscillator of claim 5, wherein said cavity is a high-Q air/vacuum dielectric cavity.

7. The oscillator of claim 6, wherein said cavity is selected from the group consisting of TE023 resonance mode and TE025 resonance mode.

8. The oscillator of claim 7, wherein said TE023 resonance mode at 100 GHz is a right circular cylindrical cavity having an approximate 1 cm cylindrical diameter and height in an open bore at a center of the cavity.

9. A cavity stabilized oscillator for producing an oscillating signal, comprising:
   a voltage controlled phase shifter (VCP) to receive a second signal and a third signal and to produce therefrom a first signal;
   a cavity to receive a fourth signal and produce therefrom the oscillating signal, said cavity having at least one cavity resonance mode;
   a power amplifier to receive the first signal and produce therefrom the fourth signal, said amplifier being disposed between the VCP and the cavity; and
   a feedback loop to receive the fourth signal and a reflection of said oscillating signal and produce therefrom the second signal, said feedback loop being disposed between the VCP and the power amplifier,
   wherein, said at least one cavity resonance mode is employed to satisfy at least one pre-determined oscillation condition in the feedback loop, and a phase noise due to the power amplifier is corrected by the VCP;
   wherein said cavity is fabricated from an ultra-stiff material; and said cavity is fabricated such that it is isolated from at least one effect selected from the group consisting of acoustic, structure-borne vibration, external temperature variation, magnetic field, electric field, and radiation field;
   wherein said ultra-stiff material is a ceramic.

10. The oscillator of claim 9, wherein said ultra-stiff material is a synthetic diamond.

11. The oscillator of claim 9, wherein the ultra-stiff material is modified to include a mechanical design that stabilizes the frequency of the at least one cavity resonance mode.

12. A cavity stabilized oscillator for producing an oscillating signal, comprising:
   a voltage controlled oscillator (VCO) coupled to an electronic frequency control (EFC) to receive a third signal to tune the generation by the VCO of a first signal phase locked to a cavity resonance mode;
   said cavity being a high-Q having a linear air/vacuum dielectric to receive a second signal and produce the oscillating signal, said cavity having at least the cavity resonance mode;

a power amplifier to receive the first signal and produce therefrom a second signal, said amplifier being disposed between the VCO and the cavity; and said first signal being phase locked by a phase locked loop (PLL) to receive a fourth signal and produce therefrom the third signal as a voltage-control tuning signal, said PLL being disposed between said amplifier and said cavity, wherein, said PLL comprises a feedback loop that receives a phase error between the second signal and an amplification of a reflection of the oscillating signal from the cavity to produce therefrom the fourth signal, said feedback loop being disposed between the EFC and the power amplifier output and the amplification of the reflection of the oscillating signal from the cavity, wherein, said cavity resonance mode is selected by a VCO frequency and said VCO is phase-locked to a center of said cavity resonance mode.

13. The oscillator of claim 12, wherein said cavity is a high-Q air/vacuum dielectric cavity comprising at least one material selected from the group consisting of a high conductivity metal and metalized material.

14. The oscillator of claim 12, wherein the reflection of the oscillating signal from the cavity further comprises a carrier-suppression technique whereby a signal to noise ratio of a phase detector component thereof is increased by the amplification of said reflection of the oscillating signal from the cavity, said phase detector component producing a fourth signal that is proportional to the phase error between the oscillating signal and said cavity resonance mode.

15. The oscillator of claim 13, wherein said VCO is selected from the group consisting of a Gunn oscillator, Yttrium-Iron-Garnet (YIG) oscillator, dielectric resonator oscillator (DRO), and coherent pulsed laser utilizing its repetition rate frequency, wherein a frequency of the VCO may be one of multiplied and divided to match a cavity resonance frequency.

16. The oscillator of claim 15, wherein the coherent pulsed laser is a femtosecond laser.

17. The oscillator of claim 12, wherein said cavity is a high-Q air/vacuum dielectric cavity comprising a material selected from the group consisting of a high conductivity metal and metalized material.

18. The oscillator of claim 17, wherein said cavity is selected from the group consisting of TE023 resonance mode and TE025 resonance mode.

19. The oscillator of claim 18, wherein said TE023 resonance mode at 100 GHz is a right circular cylindrical cavity having an approximate 1 cm cylindrical diameter and height in an open bore at a center of the cavity.

20. The oscillator of claim 12, wherein:

said cavity is fabricated from an ultra-stiff material; and said cavity is fabricated such that it is isolated from at least one effect selected from the group consisting of acoustic, structure-borne vibration, external temperature variation, magnetic field, electric field, and radiation field.

21. The oscillator of claim 20, wherein said ultra-stiff material is a ceramic.

22. The oscillator of claim 20, wherein said ultra-stiff material is a synthetic diamond.

23. The oscillator of claim 20, wherein said ultra-stiff material is modified to include a mechanical design that stabilizes the frequency of the at least one cavity resonance mode.

* * * * *